(12) United States Patent
Beylor et al.

(10) Patent No.: US 6,967,539 B2
(45) Date of Patent: Nov. 22, 2005

(54) LOW PHASE-NOISE LOCAL OSCILLATOR AND METHOD

(75) Inventors: Michael R. Beylor, Tucson, AZ (US); Wesley H. Dwelly, Sahuarita, AZ (US); Vinh Adams, Tucson, AZ (US); Dennis C. Braunreiter, Oro Valley, AZ (US); Harry A. Schmitt, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 30 days.

(21) Appl. No.: 10/643,278

(22) Filed: Aug. 18, 2003

(65) Prior Publication Data

US 2005/0040902 A1 Feb. 24, 2005

(51) Int. Cl.[7] .............................................. H05B 1/00
(52) U.S. Cl. ...................... 331/74; 333/156; 333/161; 327/158; 327/186; 327/227; 331/176; 331/187
(58) Field of Search ................... 257/661–665; 327/158, 527, 186, 227; 505/215; 333/156, 161; 331/74, 176, 187

(56) References Cited

U.S. PATENT DOCUMENTS 5,258,626 A * 11/1993 Suzuki et al. ................ 505/181
6,147,561 A * 11/2000 Rhee et al. .................... 331/12
6,377,315 B1 * 4/2002 Carr et al. ................... 348/726

FOREIGN PATENT DOCUMENTS

JP 62272619 * 11/1987

OTHER PUBLICATIONS

Koh et al. "Fabrication of Superconducting Delay Line with GaAs Schotty Didoe" IEEE transactions on Applied Superconductivity, vol. 9, No 2, Jun. 1999, pp3224–3227.*

Ruggiero et al. "Superconducting Devices"Academic Press, INC. 1990, pp241–242.*

* cited by examiner

Primary Examiner—Michael B. Shingleton
(74) Attorney, Agent, or Firm—Thomas J. Finn; Leonard Alkov; Karl Vick

(57) ABSTRACT

An oscillator to generate a low phase-noise reference signal at an oscillation frequency includes a frequency generator to generate the reference signal responsive to a control signal, and a delay element made of a high-temperature superconductor material. The delay element time-delays the reference signal and provides a low phase-noise time-delayed reference signal when cooled to a cryogenic temperature. The oscillator includes a phase detector to generate the control signal from a phase difference between the time-delayed reference signal and a phase-shifted reference signal. The delay element may comprise a coplanar waveguide having a length between 500 and 1000 meters arranged randomly on a substrate having a diameter of between five and thirteen centimeters. The delay element may provide a delay ranging from five to fifteen microseconds. The coplanar waveguide may be comprised of Yttrium-Barium-Copper Oxide disposed on either a Lanthanum-Aluminum Oxide or a Magnesium Oxide substrate.

23 Claims, 4 Drawing Sheets

LOW PHASE-NOISE LOCAL OSCILLATOR AND METHOD

TECHNICAL FIELD

Embodiments of the present invention pertain to local oscillators and methods of generating low phase-noise reference signals, and in some embodiments, to radar and communication systems and controlling phase-noise in such systems.

BACKGROUND

Low phase-noise oscillators are important in radio frequency (RF) communication systems and radar systems for generating reference signals. Phase-noise refers to the random phase instability of a signal and may result in a frequency variation in the signal that may appear as energy at frequencies other than the carrier frequency. Close-in phase-noise generally refers to phase-noise that appears at frequencies close to the carrier frequency (e.g., about 5 to 10 kHz).

In the case of radar systems, close-in phase-noise may make it difficult for a radar receiver to detect low-Doppler radar signals or a Doppler-shifted signal close to a pulse-repetition-frequency (PRF) line, or close to a pulse-repetition frequency (PRF) (e.g., a rate at which radar pulses may be transmitted). Sometimes, the PRF spectrum lines may create areas that the radar system must mask out, creating detection holes. Phase-noise may make these detection holes wider. Also in the case of radar systems, close-in phase-noise may also make it difficult for a radar receiver to detect small target returns close to clutter, and in some cases, may make it difficult to detect very large target returns. In the case of RF communication systems, close in phase-noise may make it difficult for a receiver to properly down-convert and/or demodulate received signals to produce accurate data signals.

Thus, there are general needs for an improved oscillator and method of generating an oscillation frequency. There are also needs for a low-phase-noise oscillator and method. There are also needs for a method and oscillator with improved cancellation of close-in phase-noise. There are also needs for a method and oscillator that provides a low phase-noise reference signal suitable for radar and RF communication systems. There are also needs for a method and oscillator that help control phase-noise in a receiver. There are also needs for a radar system that can detect small target returns close to clutter.

SUMMARY

An oscillator to generate a low phase-noise reference signal at an oscillation frequency includes a frequency generator to generate the reference signal responsive to a control signal, and a delay element made of a high-temperature superconductor (HTS) material. The delay element time-delays the reference signal and provides a low phase-noise time-delayed reference signal when cooled to a cryogenic temperature. The oscillator includes a phase detector to generate the control signal from a phase difference between the time-delayed reference signal and a phase-shifted reference signal. The delay element may comprise a coplanar waveguide having a length between 500 and 1000 meters arranged randomly on a substrate having a diameter of between five and thirteen centimeters. The delay element may provide a delay ranging from five to fifteen microseconds. The coplanar waveguide may be comprised of an HTS material, such as Yttrium-Barium-Copper Oxide, disposed on either a Lanthanum-Aluminum Oxide or a Magnesium Oxide substrate.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

In embodiments, the present invention provides an improved oscillator and method of generating an oscillation frequency. The present invention also provides a low-phase-noise oscillator and method. The present invention also provides a method and oscillator with improved cancellation of close-in phase-noise. The present invention also provides a method and oscillator that provides a low phase-noise reference signal suitable for radar and RF communication systems. The present invention also provides a method and oscillator that help control phase-noise in a receiver. The present invention also provides a radar system that can detect small target returns close to clutter.

Figure 1:
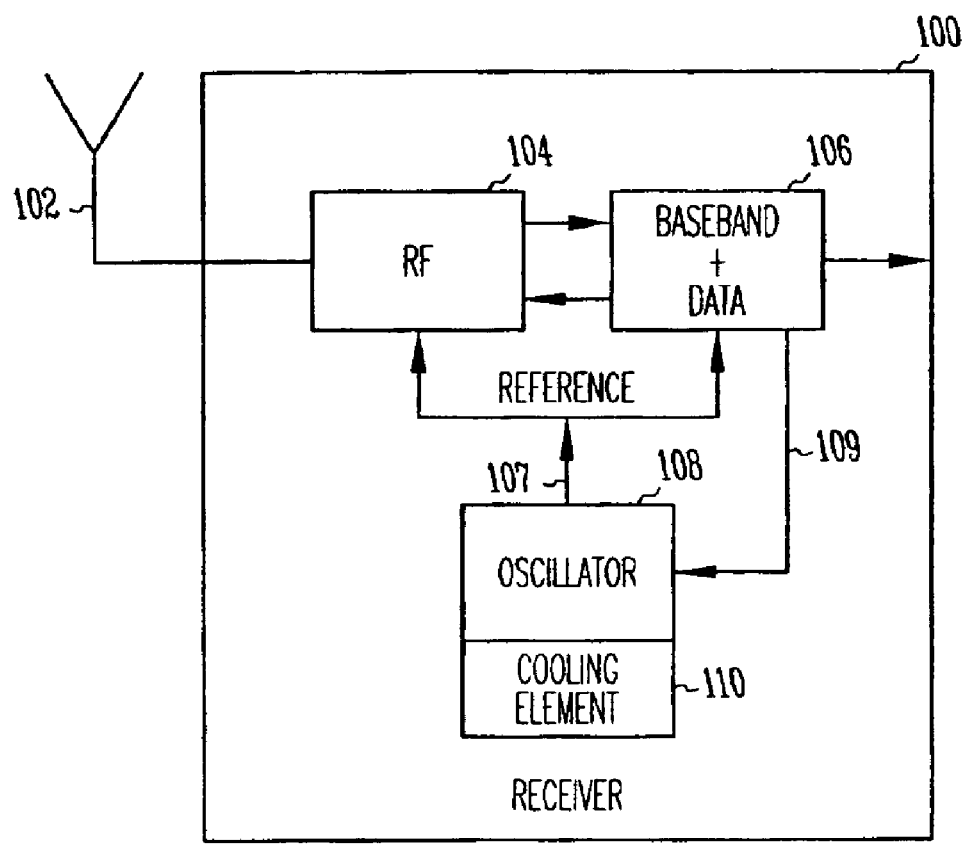
FIG. 1 is a functional block diagram of a receiver in accordance with embodiments of the present invention.

FIG. 1 is a block diagram of a receiver in accordance with embodiments of the present invention. Receiver 100 receives radio-frequency (RF) communications with antenna 102. RF signals received from antenna 102 may be down-converted to baseband signals by RF conversion unit 104 and provided to baseband unit 106. Baseband unit 106 may convert the baseband signals to data signals for use by other elements (not illustrated) of receiver 100. Oscillator 108 provides reference signal 107 to RF conversion unit 104 and/or baseband unit 106 for use in converting and processing signals. Reference signal 107 may be a low phase-noise signal at a predetermined oscillation frequency and may serve, for example, as a carrier frequency and/or local-oscillator frequency for receiver 100. Reference signal 107 may also serve as a reference signal for one or more phase-locked loops of receiver 100.

Many radar and communication systems may benefit from a low phase-noise reference because noise sidebands added by a local oscillator to signals inside and outside the receiver's intermediate frequency (IF) passband may overlap. If the IF passband is busy, each of the many signals present may add sets of noise sidebands. The effect is cumulative producing the appearance of a high-background noise level.

Oscillator 108 may comprise a frequency generator to generate reference signal 107 at an oscillation frequency, and a delay element to time-delay the reference signal and provide a low phase-noise time-delayed reference signal. The delay element may comprise a high-temperature superconductor (HTS). Oscillator 108 may also comprise a phase detector to generate a control signal from a phase difference between the low phase-noise time-delayed reference signal and a phase-shifted reference signal. The control signal may be used to control the frequency generator.

Superconductors refer to materials in which their loss or resistance drops to close to zero at a temperature very close to absolute zero. High temperature superconductors (HTS), as used herein, refer to materials in which their loss or resistance drops to close to zero at a temperature which may be much greater than absolute zero. For HTS, the critical temperature to achieve superconductivity may be as high as 30 to 120 degrees Kelvin, and may be even greater for some materials. At temperatures greater than the critical temperature, HTS may exhibit a much greater loss/resistance.

Low phase-noise, as used herein, may refer to a signal that may exhibit small deviations from oscillation frequency and may be described in dBc/Hz. The term, "low phase-noise", may also be relative to the particular frequency band. Some examples of low phase-noise specifications may include approximately 125 dBc/Hz at 10 KHz for Ka-band frequencies, and approximately 135 dBc/Hz at 10 KHz for X-band frequencies. Some examples of more recent low phase-noise specifications may include approximately 130 dBc/Hz at 5 KHz for Ka-band frequencies, and approximately 140 dBc/Hz at 5 KHz for X-band frequencies.

In some embodiments, the delay element may comprise a coplanar waveguide of a high-temperature superconductor material. The coplanar waveguide may operate as a delay line to provide the low phase-noise time-delay when cooled to a cryogenic temperature. In these embodiments, the coplanar waveguide may be arranged on the semiconductor substrate in a substantially random pattern to reduce and/or offset coupling between adjacent waveguide structures on the substrate. System 100 may also comprise cooling element 110 to reduce the temperature of the delay element of oscillator 108 to provide the low phase-noise time-delayed reference signal. Cooling element 110 may cool the delay element to within a cryogenic temperature range, which may help eliminate any noise added by the delay element.

In some embodiments one or more control signals, such as control signals 109, may be used to control the temperature of the cooling element used to cool the delay element of oscillator 108 to a temperature within a cryogenic temperature range. One or more of the control signals may also be used to control a phase shift provided by a phase shifter of oscillator 108.

Receiver 100 may be suitable for use as any receiver portion of a wireless communication device. In some embodiments, receiver 100 may be a radar receiver and may detect Doppler-shifted signals, including radar signals with low-Doppler shifts close to a pulse-repetition-frequency (PRF) line, or close to a pulse-repetition frequency (PRF) (e.g., a rate at which radar pulses may be transmitted). In conventional systems, the PRF spectrum lines may create areas that the radar system must mask out, creating detection holes, and phase-noise may make these detection holes wider. Low-Doppler radar signals may refer to slow-moving targets which, in conventional systems, may be masked by phase-noise spreading the energy received from clutter.

In other embodiments, receiver 100 may be part of a personal digital assistant (PDA), a laptop or portable computer with wireless communication capability, a web tablet, a wireless telephone, a wireless headset, a pager, an instant messaging device, an MP3 player, a digital camera, an access point or other device that may receive and/or transmit information wirelessly. In some embodiments, RF conversion unit 104 may transmit and/or receive RF communications in accordance with specific communication standards, such as the standards for wireless local area network standards, although unit 104 may also be suitable to transmit and/or receive communications in accordance with other techniques. Antenna 102 may comprise a directional or omni-directional antenna, including, for example, a phased-array antenna, a dipole antenna, a monopole antenna, a loop antenna, a microstrip antenna or other type of antenna suitable for reception and/or transmission of RF signals which may be processed by unit 104.

Although receiver 100 is illustrated as having several separate functional elements, one or more of the functional elements may be combined and may be implemented by combinations of software-configured elements, such as processing elements including digital signal processors (DSPs), and/or other hardware elements. For example, processing elements may comprise one or more microprocessors, DSPs, application specific integrated circuits (ASICs), and combinations of various hardware and logic circuitry for performing at least the functions described herein.

Figure 2:
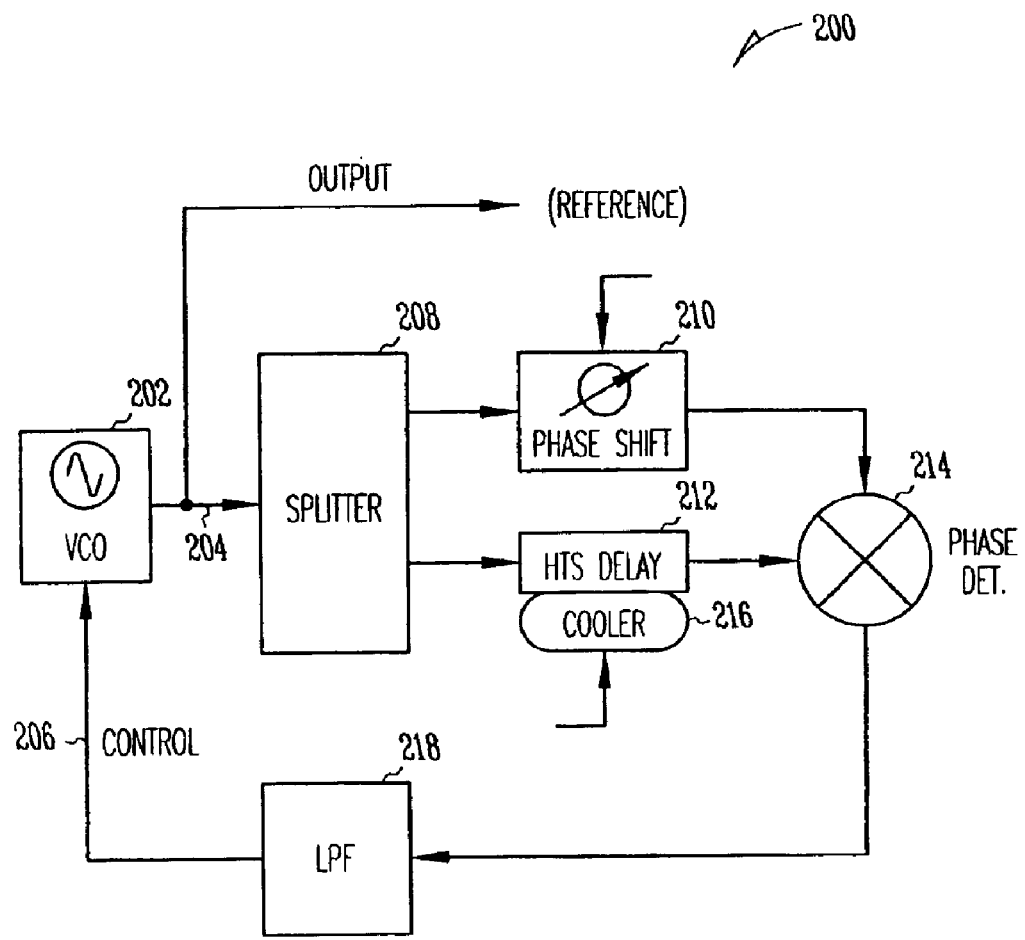
FIG. 2 is a functional block diagram of an oscillator in accordance with embodiments of the present invention.

FIG. 2 is a functional block diagram of an oscillator in accordance with embodiments of the present invention. Oscillator 200 may be suitable for use as oscillator 108 (FIG. 1) although other oscillators are also suitable. Oscillator 200 may include frequency generator 202 to generate reference signal 204 at an oscillation frequency in response to control signal 206. Frequency generator 200 may be a voltage controlled oscillator (VCO) responsive to a control voltage, and in some embodiments, frequency generator 202 may comprise a surface-acoustic wave (SAW) oscillator. Oscillator 200 may also comprise signal splitter 208, phase shifter 210, delay element 212, and phase detector 214. Signal splitter 208 may split or divide reference signal 204 to provide the reference signal to both phase shifter 210 and delay element 212. Phase shifter 210 may phase shift the reference signal to provide a phase-shifted reference signal to phase detector 214. Delay element 212 may time delay the reference signal to provide a time-delayed reference signal to phase detector 214. In some embodiments, phase detector 214 may be a mixer, although almost any phase-detection element may be suitable. When cooled to within a cryogenic temperature range by cooling element 216, delay element 212 may provide a low phase-noise time-delayed reference signal to phase detector 214. Phase shifter 210 may provide a phase-shifted reference signal having approximately ninety-degree difference from the time-delayed signal provided by delay element 212. Combining a ninety-degree phase shifted reference signal with a low phase-noise delayed reference signal in phase detector 214 helps cancel phase-noise.

Phase detector 214 may generate the control signal based on the phase difference between the time-delayed reference signal provided by delay element 212 and the phase-shifted reference signal provided by phase shifter 210. When, for example, the signals are separated in phase by ninety degrees, the phase detector may provide a zero-volt control signal. Oscillator 200 may also comprise feedback filter 218, which may be a low-pass filter, to filter the control signal and provide a filtered control signal to frequency generator 202. The gain, roll off and phase characteristics of feedback filter 218 may be chosen and/or controlled to match frequency generator 202 to help optimize phase-noise minimization.

In embodiments, delay element 212 may comprise a high-temperature superconductor (HTS) disposed a semiconductor substrate to provide a low phase-noise time delay when cooled to within a cryogenic temperature range. In embodiments, the delay element may comprise almost any microwave or high-frequency transmission line structure including, for example, coplanar waveguide, microstrip lines, suspended microstrip, stripline, etc.

In some embodiments, the high-temperature superconductor may comprise Yttrium-Barium-Copper Oxide ($YBa_2CU_3O_7$) and the substrate may comprise either Lanthanum-Aluminum Oxide ($LaAlO_3$) or Magnesium Oxide (MgO), although the scope of the invention is not limited in this respect. Newer higher-temperature superconductors including those currently being developed and those which may be developed in the future are within the scope of the present invention.

In embodiments, delay element 212 may time-delay the reference signal and may provide a low phase-noise time-delayed reference signal when cooled to a cryogenic temperature ranging between 30 and 120 degrees Kelvin, although the scope of the invention is not limited in this respect. Embodiments of the present invention include the cooling of delay element 212 to any temperature to provide superconducting, including cooling to temperatures below 80 degrees Kelvin. In one embodiment, a high temperature superconductor of Yttrium-Barium-Copper Oxide may be cooled to approximately 77 degrees Kelvin.

In some embodiments, the waveguide substructure (e.g., a coplanar waveguide) may have a length between 100 and 1000 meters, and even greater, and may provide the time delay ranging from between five and fifteen microseconds. In some embodiments, the substrate may have a diameter of between approximately 5 and 13 centimeters (approximately 2 to 5 inches) or greater, and may be arranged on the substrate in a substantially random pattern. In some embodiments, the oscillation frequency comprises a frequency between approximately 500 Mega-Hertz and six Giga-Hertz.

Figure 3:
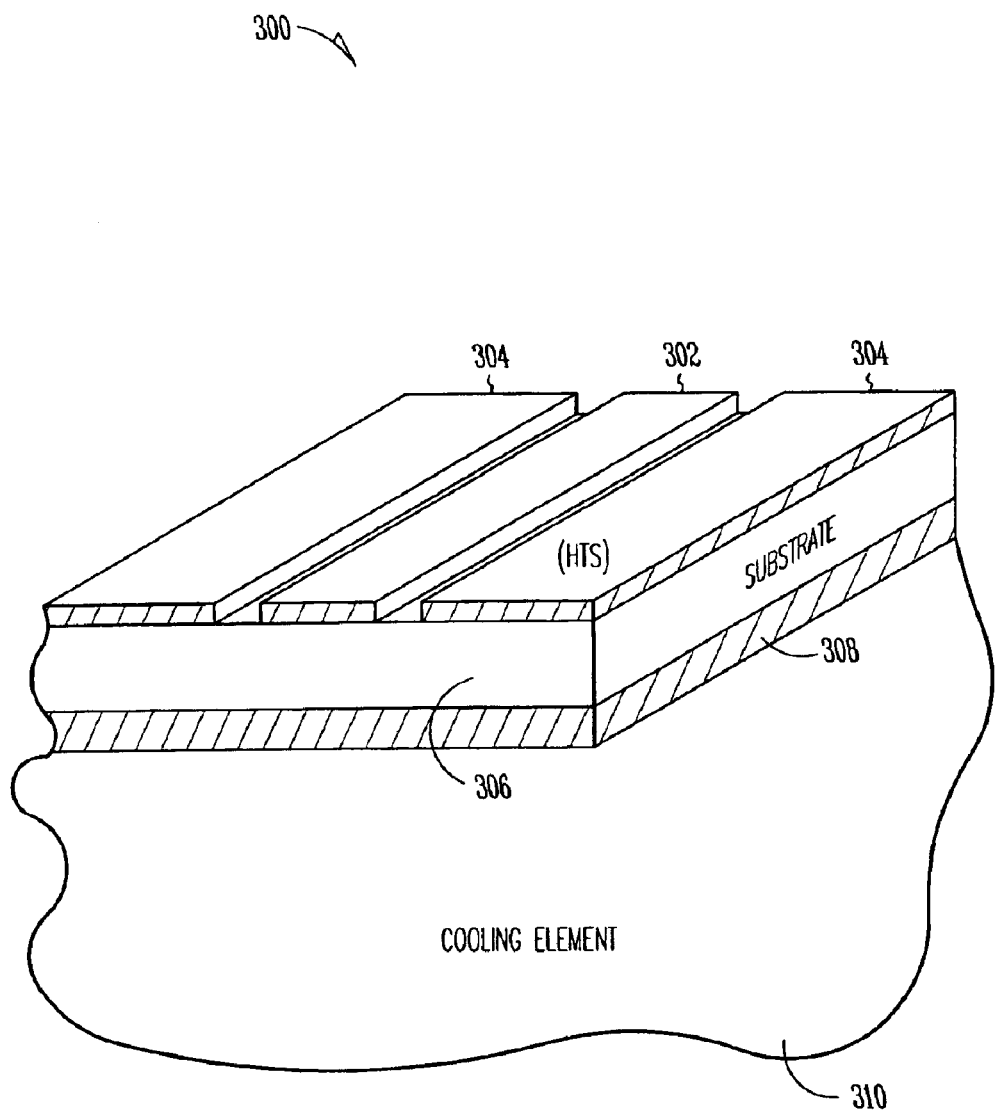
FIG. 3 illustrates a portion of a high-temperature superconductor delay element in accordance with embodiments of the present invention.

FIG. 3 illustrates a portion of a high-temperature superconductor delay element in accordance with embodiments of the present invention. Portion 300 may comprise a coplanar waveguide structure that may be suitable for use as a portion of delay element 212 (FIG. 2) although other delay element structures are also suitable. Portion 300 comprises center signal conductor 302 and ground-signal conductors 304. Conductors 302 and 304 may be disposed on substrate 306 and may have ground plane 308. The spacing between conductors 302 and 304 and the thickness of substrate 306 may depend on the materials used as well as the frequency of operation.

In accordance with embodiments of the present invention, conductors 302 and 304 comprise a high-temperature superconductor, including Yttrium-Barium-Copper Oxide ($YBa_2CU_3O_7$). Substrate 306 may comprise a semiconductor substrate material such as Lanthanum-Aluminum Oxide ($LaAlO_3$) or Magnesium Oxide (MgO). Ground plane 308 may comprise almost any conductive material including HTS materials, and in some embodiments, may comprise the same HTS material used for conductors 302 and 304. In embodiments, portion 300 may be cooled by cooling element 310 to cool portion 300 to within a cryogenic temperature range allowing the delay element to provide a low phase-noise time-delayed signal for use in the oscillator. Cooling element 310 may correspond to cooling element 216 (FIG. 2) and/or cooling element 110 (FIG. 1).

In some embodiments, the substrate may have a diameter of between approximately 5 and 13 centimeters (approximately 2 to 5 inches) and the waveguide structure may be arranged on the substrate in a substantially random pattern. This may help reduce and/or offset coupling between adjacent lines. In these embodiments, the length of the coplanar waveguide structure may range from 100 to 1000 meters, and even greater depending on the size/diameter of the substrate available. The greater the delay, the greater the amount of phase-noise, especially the closer in phase-noise, that can be cancelled to achieve a lower phase-noise reference signal. In embodiments, the low phase-noise signal results from phase cancellation produced by detecting frequency deviations of the oscillator with a long delay line and feeding them back out-of-phase to the VCO control.

Figure 4:
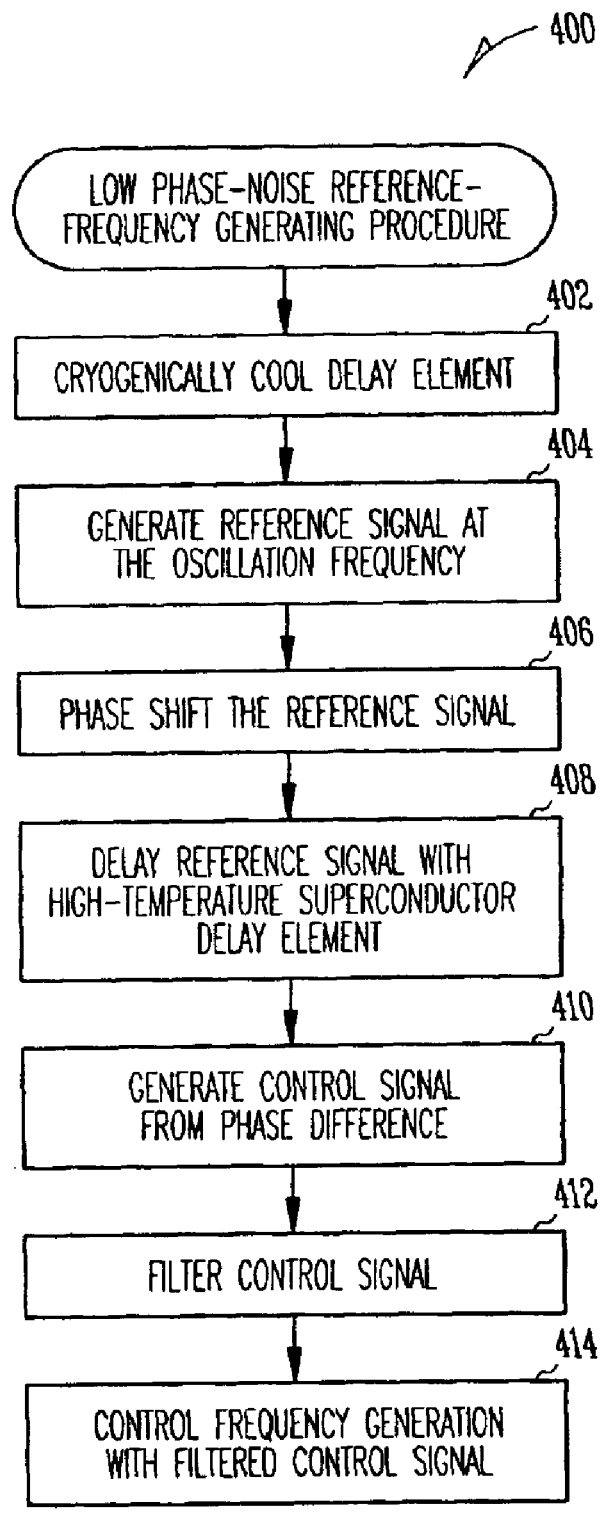
FIG. 4 is a flow chart of a low phase-noise reference frequency generating procedure in accordance with embodiments of the present invention.

FIG. 4 is a flow chart of a low phase-noise reference frequency generating procedure in accordance with embodiments of the present invention. Low phase-noise reference frequency generating procedure 400 may be performed by oscillator 200 (FIG. 2) although other oscillators and elements may perform procedure 400. Procedure 400 may also be used to generate a low phase-noise reference signal, such as signal 107 (FIG. 1), for use by elements of a receiver, such as receiver 100 (FIG. 1). Although the individual operations of procedure 400 are illustrated and described as separate operations, one or more of the individual operations may be performed concurrently and nothing requires that the operations be performed in the order illustrated.

In operation 402, a delay element may be cooled to within a cryogenic temperature range, which may range from 30 to 120 degrees Kelvin. The delay element may comprise a high-temperature superconductor which provides low-phase-noise when cooled to a temperature within a cryogenic temperature range. In operation 404, a reference signal is generated at an oscillation frequency in response to a control signal. Operation 404 may be performed by a VCO, and in some embodiments, by a SAW VCO. In operation 406, the reference signal may be phase shifted.

In operation 408, the reference signal may be delayed by a time delay and a low phase-noise time-delayed reference signal is generated. Operation 408 may be performed by the delay element that was cryogenically cooled in operation 402, which limits the addition of noise resulting from the delay element.

In operation 410, the control signal is generated from the phase-shifted reference signal generated in operation 406 and the time-delayed reference signal generated in operation 408. In one embodiment, operation 406 may phase shift the reference signal to generate a phase-shifted reference signal having substantially a ninety-degree phase difference from the low phase-noise time-delayed reference signal generated in operation 408. Accordingly, operation 410 may provide about a zero-volt control signal when the time-delayed signal and phase-shifted signal have exactly a ninety-degree phase difference therebetween (e.g., when there is no phase-noise). Any phase-noise present may show up on the control signal.

In operation 412, the control signal generated in operation 410 may be low-pass filtered to help reduce the addition of phase-noise at higher frequencies (e.g., the far out phase-noise) which may degrade the performance of the oscillator. In operation 414, the frequency generation of operation 404 may be controlled with the filtered control signal from operation 412 as part of a feedback loop to maintain the generation of a low phase-noise reference signal.

Thus, an improved oscillator and method of generating an oscillation frequency have been described. A low phase-noise oscillator and method has also been described. A method and oscillator with improved cancellation of close-in phase-noise have also been described. A method and oscillator that provides a low phase-noise reference signal suitable for radar and RF communication systems have also been described. A method and oscillator that help control phase-noise in a receiver have also been described. A radar system that can detect small target returns close to clutter has also been described.

It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. A low phase-noise oscillator comprising:
   a frequency generator to generate a reference signal at an oscillation frequency responsive to a control signal;
   a delay element comprising a high-temperature superconductor to time-delay the reference signal and provide a low phase-noise time-delayed reference signal;
   a variable phase shifter to generate a phase-shifted reference signal; and
   a phase detector to generate the control signal from a phase difference between the low phase-noise time-delayed reference signal and the a phase-shifted reference signal,
   wherein during operation, the control signal is to cause the frequency generator to change the oscillation frequency to drive the phase difference between the low phase-noise time-delayed reference signal and the phase-shifted reference signal to substantially ninety degrees.

2. The oscillator of claim 1 wherein the high-temperature superconductor is disposed on a semiconductor substrate to provide the low phase-noise time-delayed reference signal when cooled to within a cryogenic-temperature range.

3. The oscillator of claim 2 wherein the delay element comprises a coplanar waveguide comprising the high-temperature superconductor, the coplanar waveguide to operate as a delay line to provide the low phase-noise time-delayed reference signal when cooled to within the cryogenic temperature range.

4. The oscillator of claim 3 wherein the coplanar waveguide is arranged on the semiconductor substrate in a substantially random pattern.

5. The oscillator of claim 1 further comprising a cooling element to reduce the temperature of the delay element.

6. The oscillator of claim 5 wherein the cooling element reduces the temperature of the delay element to within a cryogenic temperature range.

7. The oscillator of claim 2 wherein the high-temperature superconductor comprises Yttrium-Barium-Copper Oxide, and wherein the substrate comprises either Lanthanum-Aluminum Oxide or Magnesium Oxide.

8. The oscillator of claim 7 wherein the delay element time-delays the reference signal and provides the low phase-noise time-delayed reference signal when cooled to a cryogenic temperature ranging between 30 and 120 degrees Kelvin.

9. The oscillator of claim 1 wherein the variable phase shifter is to phase shift the reference signal to generate the phase-shifted reference signal; and
   wherein the oscillator further comprises a signal splitter to split the reference signal from the frequency generator and provide the reference signal to both the phase shifter and delay element,
   wherein the phase shift provided by the variable phase shifter is selectable to set the oscillation frequency.

10. The oscillator of claim 9 wherein the frequency generator is a voltage controlled oscillator (VCO), and the control signal is a control voltage generated by the phase detector.

11. The oscillator of claim 10 wherein the frequency generator is surface acoustic wave (SAW) VCO.

12. A low phase-noise oscillator comprising:
   a frequency generator to generate a reference signal at an oscillation frequency responsive to a control signal;
   a delay element comprising a high-temperature superconductor to time-delay the reference signal and provide a low phase-noise time-delayed reference signal;
   a phase detector to generate the control signal from a phase difference between the low phase-noise time-delayed reference signal and a phase-shifted reference signal;
   a phase shifter to phase shift the reference signal to generate the phase-shifted reference signal;
   a signal splitter to split the reference signal from the frequency generator and provide the reference signal to both the phase shifter and delay element; and
   a low-pass filter to filter the control signal and provide a filtered control signal to the frequency generator,
   wherein the frequency generator is a voltage controlled oscillator (VCO) comprising a surface acoustic wave (SAW) VCO.
   wherein the control signal is a control voltage generated by the phase detector, and
   wherein the phase shifter is a variable phase shifter to generate the phase-shifted reference signal having approximately ninety-degree phase difference from the time-delayed reference signal.

13. The oscillator of claim 12 wherein:
   the delay element comprises a coplanar waveguide comprising the high-temperature superconductor, the coplanar waveguide to operate as a delay line to provide the low phase-noise time-delayed reference signal when cooled to a cryogenic temperature;
   the coplanar waveguide has a length between 100 and 1000 meters to provide the time delay ranging from between five and fifteen microseconds;
   the substrate has a diameter of between approximately 5 and 13 centimeters and the coplanar waveguide is arranged on the substrate in a substantially random pattern;

the high-temperature superconductor comprises Yttrium-Barium-Copper Oxide to be cooled to approximately 77 degrees Kelvin, and the substrate comprises either Lanthanum-Aluminum Oxide or Magnesium Oxide; and the oscillation frequency comprises a frequency between approximately 500 Mega-Hertz and six Giga-Hertz.

14. A receiver comprising:

a radio-frequency section to down-convert received RF signals using a low phase-noise reference signal; and an oscillator to generate the low phase-noise reference signal at an oscillation frequency, the oscillator comprising a frequency generator to generate the reference signal responsive to a control signal, a delay element comprising a high-temperature superconductor to time-delay the reference signal and provide a low phase-noise time-delayed reference signal when cooled to a cryogenic temperature, a variable phase shifter to generate a phase-shifted reference signal, and a phase detector to generate the control signal from a phase difference between the time-delayed reference signal and the a phase-shifted reference signal, wherein during operation of the oscillator, the control signal is to cause the frequency generator to change the oscillation frequency to drive the phase difference between the low phase-noise time-delayed reference signal and the phase-shifted reference signal to substantially ninety degrees.

15. The receiver of claim 14 wherein the low phase-noise reference signal exhibits deviations of less than approximately 125 dBc/Hz at 10 KHz for a Ka-band oscillation frequency, and less than approximately 135 dBc/Hz at 10 KHz for an X-band oscillation frequency.

16. The receiver of claim 15 wherein the delay element comprises a coplanar waveguide comprising the high-temperature superconductor, the coplanar waveguide to operate as a delay line to provide the low phase-noise time delayed reference signal when cooled to within a cryogenic temperature range.

17. The receiver of claim 16 wherein the coplanar waveguide is arranged on a semiconductor substrate in a substantially random pattern to provide a time-delay of between 5 and 15 microseconds.

18. The receiver of claim 17 further comprising a cooling element to reduce the temperature of the delay element to within the cryogenic temperature range.

19. The receiver of claim 18 wherein the receiver is part of a radar system to detect low-Doppler radar signals.

20. A method of generating a low phase-noise reference signal comprising:

generating a reference signal at an oscillation frequency in response to a control signal;

phase-shifting the reference signal to generate a phase-shifted reference signal;

time delaying the reference signal with a delay element comprising a high-temperature superconductor cooled to within a cryogenic temperature range to generate a low phase-noise time-delayed reference signal; and generating the control signal from a phase difference between the time-delayed reference signal and the phase-shifted reference signal, wherein the control signal is to change the oscillation frequency to drive the phase difference between the low phase-noise time-delayed reference signal and the phase-shifted reference signal to substantially ninety degrees, and wherein an amount of phase shift applied by the phase-shifting is selectable to set the oscillation frequency.

21. The method of claim 20 wherein time delaying comprises time delaying the reference signal through a coplanar waveguide comprising the high-temperature superconductor, the coplanar waveguide operating as a delay line to provide the low phase-noise time-delayed reference signal when cooled to within the cryogenic temperature range.

22. The method of claim 21 further comprising cryogenically cooling the delay element to generate the low phase-noise time-delayed reference signal.

23. The method of claim 21 further comprising:

phase shifting the reference signal to generate the phase-shifted reference signal to have approximately ninety-degree phase difference from the low phase-noise time-delayed reference signal;

low-pass filtering the control signal; and controlling a frequency generator with the filtered control signal to generate the reference signal.

* * * * *